(12) United States Patent
McKean et al.

(10) Patent No.: US 8,785,222 B2
(45) Date of Patent: Jul. 22, 2014

(54) PHOSPHOR INK COMPOSITION

(75) Inventors: Dennis McKean, Hong Kong (CN); Pan Man Wong, Hong Kong (HK); Wenbo Ma, Hong Kong (HK)

(73) Assignee: Hong Kong Applied Science and Technology Research Institute Company Limited, Hong Kong Science Park Shatin, New Territories, Hong Kong (CN)

(*) Notice: Subject to any disclaimer, the term of this patent is extended or adjusted under 35 U.S.C. 154(b) by 73 days.

(21) Appl. No.: 13/561,104

(22) Filed: Jul. 30, 2012

(65) Prior Publication Data

US 2012/0286208 A1   Nov. 15, 2012

Related U.S. Application Data

(63) Continuation-in-part of application No. 13/103,117, filed on May 9, 2011, now Pat. No. 8,329,485.

(51) Int. Cl.
| | |
|---|---|
| *H01L 21/00* | (2006.01) |
| *B05D 5/06* | (2006.01) |
| *C09D 11/00* | (2014.01) |
| *H01L 51/50* | (2006.01) |
| *C09K 11/77* | (2006.01) |
| *C09D 11/10* | (2014.01) |
| *B02C 17/20* | (2006.01) |

(52) U.S. Cl.
CPC ............ *C09K 11/7774* (2013.01); *C09D 11/00* (2013.01); *H01L 51/50* (2013.01); *C09K 11/7734* (2013.01); *C09D 11/101* (2013.01); *B02C 17/205* (2013.01)
USPC .......................... 438/29; 427/64; 252/301.36

(58) Field of Classification Search
USPC .............................................. 438/29; 427/64
See application file for complete search history.

(56) References Cited

U.S. PATENT DOCUMENTS 6,604,971 B1    8/2003   Sun et al.
7,126,265 B2 *  10/2006  Jermann et al. ............... 313/485

(Continued)

FOREIGN PATENT DOCUMENTS

| CN | 101320772 B | 6/2010 |
| TW | 201202356 A1 | 1/2012 |
| WO | WO/00/56486 A1 | 9/2000 |

OTHER PUBLICATIONS

Tran. N.T., You, J.P., and Shi, F.G. (2009), "Effect of phosphor particle size on luminous efficacy of phosphor-converted white LED," IEEE Journal of Lightwave Technology, vol. 27, pp. 5145-5150, Nov. 2009.

(Continued)

*Primary Examiner* — Lex Malsawma
(74) *Attorney, Agent, or Firm* — Ella Cheong Hong Kong; Sam T. Yip (57) ABSTRACT

The present invention provides phosphor inks configured to achieve high efficiency in converting LED light from one wavelength to another. The phosphor ink composition for deposition on an LED device comprises a phosphor component having nano-phosphor particles on the order of 100 to 1000 nanometers, and a curable resin component. In particular, the nano-phosphor particles are uniformly dispersed throughout the ink composition. The nano-phosphor particles may be formed by a size reduction process carried out on larger phosphor particles on the order of 1 to 50 micrometers. Preferably, the size reduction process is based on solvent wet milling. Methods for preparing the phosphor inks based on forming the nano-phosphor particles from larger particles by solvent wet milling are also provided.

19 Claims, 3 Drawing Sheets

(56) References Cited

U.S. PATENT DOCUMENTS

| | | |
|---|---|---|
| 7,476,411 B1 * | 1/2009 | Hampden-Smith et al. .... 427/64 |
| 7,524,437 B2 | 4/2009 | Sakane et al. |
| 7,887,718 B2 | 2/2011 | Nagatomi et al. |
| 8,048,338 B2 | 11/2011 | Nagatomi et al. |
| 8,062,549 B2 | 11/2011 | Nagatomi et al. |
| 8,125,139 B2 | 2/2012 | Emoto et al. |
| 2002/0041372 A1 * | 4/2002 | Gardner et al. ................ 356/71 |
| 2004/0173807 A1 | 9/2004 | Tian et al. |
| 2007/0024173 A1 | 2/2007 | Braune |
| 2011/0045619 A1 | 2/2011 | Ling |
| 2011/0068303 A1 * | 3/2011 | Buissette et al. ....... 252/301.4 R |

OTHER PUBLICATIONS

Hou, T.-H., Su, C.-H., and Liu, W.-L. (2007), "Parameters optimization of a nano-particle wet milling process using the Taguchi method, response surface method and genetic algorithm," Powder Technology, vol. 173, Issue 3, pp. 153-162, Apr. 30, 2007.

Office Action issued from the Taiwan Intellectual Property Office on Jan. 20, 2014, including a search report.

* cited by examiner

PHOSPHOR INK COMPOSITION

CROSS-REFERENCE TO RELATED APPLICATION

This application is a continuation-in-part of U.S. patent application Ser. No. 13/103,117 filed May 9, 2011, the disclosure of which is incorporated by reference herein.

TECHNICAL FIELD

The present invention relates generally to phosphor inks for LEDs and/or LED devices. In particular, it relates to phosphor inks configured to have nano-sized phosphor particles which can achieve high efficiency in converting LED light from one wavelength to another and a method of making the inks.

BACKGROUND

A light emitting diode ("LED") is a semiconductor light source. LEDs provide numerous advantages over other light sources such as incandescent lights. Amongst other advantages, LEDs typically have longer lifetimes, greater reliability, faster switching characteristics and lower energy consumption. Recent advances have produced LEDs with luminous efficiencies (lumen per Watt) that are comparable with or surpass fluorescent lights.

LEDs produce light by the spontaneous recombination of electron and hole pairs when the LED is forward biased above the threshold voltage in an electronic circuit. The wavelength of the light produced depends upon the band gap between the materials used in the p-n junction that form the LED. The wavelength of the light produced by an LED is typically in the infra red, visible or UV ranges. Detailed information on LEDs is found in "*Light emitting diodes*" by E. Fred Schubert, Cambridge University Press, which is hereby incorporated in its entirety by reference. Detailed information on semiconductor optics is found in "*Semiconductor optics*" by Claus F. Klingshirn, Springer press, which is hereby incorporated in its entirety by reference.

For ease of manufacturing, the most common form of LED is typically on the order of a micron-sized planar square LED die disposed on a substrate. The semiconductor comprising the die is usually gallium nitride, and the substrate may be a metal such as aluminum, which also functions as a heat sink. The LED die is electrically connected to circuitry on the substrate by fine metal wires. The LED die itself may be surface mounted on the substrate, or within a cavity on the substrate.

Various challenges exist in producing a LED with a high luminous output that is suitable for use as a light source in human environments. The first is maximizing light extraction from the planar LED die itself. As semiconductor materials have a high refractive index, a large quantity of the light produced undergoes total internal reflection (TIR) at the semiconductor-air interface. It is known in the art to reduce the amount of light that undergoes TIR by reducing the difference between the refractive indices at the semiconductor surface. As the semiconductor refractive index is a material characteristic, this is achieved by encapsulating the LED with an encapsulating material having a higher refractive index. Historically an epoxy material was used, and more recently silicone due to its comparatively higher transparency, color stability and thermal performance.

A single unencapsulated LED produces monochromatic light. Due to the interest in using LEDs as ambient lighting sources, in recent years research has focused on producing LED packages that emit light of different colors to that emitted by the LED die. There has been considerable interest in producing white light. The most popular way of producing white light from a single LED is by disposing a wavelength converting material, such as a yellow phosphor, on the visible (emitting) side of a blue-light emitting LED die. A layer of wavelength converting material applied on the LED die will absorb some of the emitted photons, and down-convert them into visible wavelength light, resulting in a dichromatic light source of blue and yellow wavelength light. If the yellow and blue light is produced in the correct proportions it is perceived by the human eye as a white color.

It is known in the art to add a wavelength converting material to the encapsulating layer surrounding the LED die as an alternative to depositing directly on the die. Application of the encapsulating material may be by different methods. Some methods use molding or pre-molding to fix encapsulant directly to the substrate, and some methods create and then fill a dam that encircles the LED die. The latter is usually referred to as dispensing as the encapsulating material is provided in liquid form followed by curing. Actually in this drop dispense method, a phosphor ink can also be applied to the surface of the LED die.

Another method known in the art for introducing a phosphor layer to an LED die is by using an ink-jet printer to ink-jet a phosphor ink on the surface of the LED die. This ink-jet printing method is described in U.S. patent application Ser. No. 13/103,117, the disclosure of which is incorporated by reference herein.

However, in conventional fabrication methods, phosphor particles on the order of 5-25 micrometers are typically used. Such particles have various disadvantages including settling in the dispersant, resulting in an uneven distribution of phosphors and non-uniform color emitted from the packaged device.

Thus there is a need in the art for improved phosphor particles for both drop dispense and ink-jet printing methods to form LED devices.

SUMMARY OF THE INVENTION

Bulk phosphor particles of size 1-50 micrometers, especially 5-25 micrometers, have high light conversion efficiencies. However, phosphor particles of such size induce serious sedimentation, causing variation in the correlated color temperature and/or color variations in the resultant light produced by a LED coated with such phosphor. Thus, nano-sized phosphor particles are of great interest because of their much slower settling rates. However, there is a problem that the nano-sized phosphor particles made by existing technologies have over 50% loss in light conversion efficiency. The present inventors have determined that, for both the drop dispense method and the ink-jet printing method, phosphor inks that contain phosphor particles which are extremely small in size, on the order of 100 to 1000 nanometers, allow high light conversion efficiency permitting formation of LEDs and/or LED devices with little correlated color temperature and/or color variations and high brightness.

The present invention provides a phosphor ink composition, configured to have phosphor particles which are very small in size and can achieve high light conversion efficiency, for deposition on an LED. The ink comprises a curable resin component, and a phosphor component comprising nano-phosphor particles on the order of 100 to 1000 nanometers. The nano-phosphor particles are formed by a size reduction process, preferably based on solvent wet milling, carried out on larger phosphor particles on the order of 1 to 50 micrometers.

After the size reduction process, the nano-phosphor particles have very slow sedimentation rate. Thus they are uniformly dispersed in the phosphor ink composition which can be used for drop dispense or ink-jet printing. Consequently, the LEDs to which they are applied have consistent correlated color temperature and/or color.

In addition, these nano-phosphor particles have very high light conversion efficiency in converting LED light from one wavelength to another. When compared with the bulk phosphor particles of size 1-50 micrometers, especially 5-25 micrometers, the light conversion efficiency of nano-phosphor particles in this invention can achieve over 90% of that using bulk phosphor particles. This is not achievable by other existing nano-phosphor particles in the market.

The phosphor inks configured for use by the drop dispense method can be formulated by mixing the nano-phosphor particles with a curable resin, preferably a thermally curable one. The thermally curable resin may be a two part silicone resin.

The phosphor inks configured for use by the ink-jet printing method include the above-mentioned phosphor component, and the curable resin as a polymer binder. The curable resin may be a UV-curable one and/or a thermally curable one. To ensure ink jetting ability of the inks by ink jet printers, the ink viscosity is maintained below approximately 50 centipoise. A solvent is provided in an amount sufficient to control the overall phosphor ink viscosity.

DETAILED DESCRIPTION

The inks according to the present invention are described below with respect to formation of a "white" LED using a combination of a blue LED packaged with yellow phosphors. However, it is understood that the present invention is applicable to the application of any phosphor to any color LED in order to tailor the color of LED as perceived by the human eye. As used herein, the term "phosphor" is used broadly to describe any wavelength converting materials that absorb light at one wavelength and emit light at another wavelength, whether or not they are considered "phosphors" in the traditional sense of the term. For blue LEDs, typical phosphors used for emitting yellow light include yttrium aluminum garnet (YAG)-based materials (optionally doped with cerium), terbium aluminum garnet (TAG)-based materials, and silicate-based, sulfur-based, nitrogen-based, or nitrogen oxide based materials. Organic phosphors can also be used as well as organic and inorganic non-phosphor-based wavelength converting materials—which, for simplicity, are termed "phosphors" as set forth above. A single wavelength converting material or a combination of wavelength converting materials can be selected depending upon the overall desired emission from the packaged LED.

A preferable range of the phosphor particle size for an LED is generally accepted to be bounded from 1 micrometer to approximately 50 micrometers. For example, US20110045619 mentions that a typical LED phosphor has a particle size from ~5 to ~25 micrometers. In another example, U.S. Pat. No. 8,125,139 suggests that an average particle size is preferably from 3 to 20 micrometers. In a further example, U.S. Pat. No. 8,048,338, U.S. Pat. No. 7,887,718, U.S. Pat. No. 8,062,549 and U.S. Pat. No. 7,524,437 suggest that, from the viewpoint of emission efficiency, the average particle sizes of the phosphors disclosed in these references are preferably to be set within 1.0 to 50 micrometers, and further preferably to be not more than 20 or 30 micrometers.

Although bulk phosphor particles of size 1-50 micrometers, especially 5-25 micrometers, have high light conversion efficiencies, phosphor particles of such size induce serious sedimentation, causing variation in the correlated color temperature and/or color variations in the resultant light produced by a LED coated with such phosphor. Thus, nano-sized phosphor particles are of great interest because of their much slower settling rates. However, there is a problem that the nano-sized phosphor particles made by existing technologies have over 50% loss in light conversion efficiency.

In one development, US20070024173 discloses the use of nano-phosphor particles in the range from 1 to 50 nanometers, preferably from 2 to 20 nanometers, for minimizing the portion of light reflected or scattered by the particles without being used in light conversion. US20070024173 also states that particle sizes in the range of 200 to 500 nanometers cause the maximum scattering of light—thus teaching away from this range of particle sizes for use in LED wavelength conversion.

The preferable ranges of phosphor particle size from 1 to approximately 50 micrometers and from 1 to 50 nanometers are supported by a detailed study of LED's lumen outputs in N. T. Tran et al. (2009), "Effect of phosphor particle size on luminous efficacy of phosphor-converted white LED," *IEEE Journal of Lightwave Technology*, vol. 27, pp. 5145-5150, November 2009, the disclosure of which is incorporated by reference herein. From simulation results, Tran et al. (2009) have shown that the lumen output decreases substantially as the particle size increases from 50 to 100 nanometers, then stays at a minimum value in the range from 100 to 500 nanometers, and then increases slightly for the particle size of 1 micrometer. The lumen output continues to increase steadily as the particle size increases from 1 micrometer. In the micron-size region, the lumen output reaches a maximum value at the particle size of around 20 micrometers, after which the lumen output drops. Similar to US20070024173, Tran et al. (2009) reason that the minimum lumen output over the range of phosphor particle size from 100 to 500 nanometers is due to pronounced scattering of light by the phosphor particles.

In view of the above, there is lacking of motivation for an ordinary person skilled in the art to use phosphor particles of size in the range from 100 to 1000 nanometers, in particular from 100 to 500 nanometers, for LEDs. Recently, however, the inventors have experimentally identified that nano-phosphor particles of size on the order of 100 to 1000 nanometers can achieve high efficiency in capturing LED light and then converting the light from one wavelength to another by photoluminescence. When compared with the bulk phosphor particles of size 1-50 micrometers, especially 5-25 micrometers, the inventors have found that the light conversion efficiency of the nano-phosphor particles of size from 100 to 1000 nanometers in this invention can achieve over 90% of that using the bulk phosphor particles. This is not achievable by other existing nano-phosphor particles, which have less than 50% light conversion efficiencies as mentioned above, in the market.

After making this discovery, the inventors have noted that U.S. Pat. No. 7,126,265 discloses a substantially spherical phosphor particle formed by aggregating a plurality of primary phosphor particles of mean particle size in the range from 100 to 1500 nanometers. The nano-phosphor particles disclosed herein in the present invention are not meant to be the primary phosphor particles disclosed in U.S. Pat. No. 7,126,265. The nano-phosphor particles disclosed herein are not intended to form one or more substantially spherical phosphor particles that are mentioned in the disclosure of U.S. Pat. No. 7,126,265.

The phosphor inks of the present invention advantageously use a phosphor component comprising nano-phosphor particles on the order of 100 to 1000 nanometers, where the nano-phosphor particles are uniformly dispersed throughout the ink composition. In order to create a particle size that will facilitate both uniform dispersion and discourage particle settling in the phosphor inks, precise size reduction techniques are performed. The nano-phosphor particles may be formed by a size reduction process carried out on larger phosphor particles on the order of 1 to 50 micrometers. In particular, it is preferable that the size reduction process is based on solvent wet milling. Solvent wet milling is a method of wet milling. A description of wet milling is given in T. F. Tadros (2012), *Dispersion of Powders in Liquids and Stabilization of Suspensions*, Wiley, 2012, the disclosure of which is incorporated by reference herein. Regarding solvent wet milling, optimization of milling process parameters can be found in T.-H. Hou et al. (2007), "Parameters optimization of a nano-particle wet milling process using the Taguchi method, response surface method and genetic algorithm," *Powder Technology*, Volume 173, Issue 3, pp. 153-162, 30 Apr. 2007, the entirety of which is hereby incorporated by reference. A discussion of solvent wet milling is also given in WO/2000/056486.

The inventors have experimentally found that in addition to achieving high light conversion efficiency, the nano-phosphor particles offer a further advantage that undesired settling of phosphor in the curable resin can be substantially improved when compared to a typical phosphor having a particle size in the range of around 5 to 25 micrometers. Advantageously, the curable resin and the size of the nano-phosphor particles can be selected such that the nano-phosphor particles settle extremely slowly in the inks after deposition and prior to curing, thereby enabling forming a uniform cured phosphor layer on the LED device or the LED device packaging.

Nano-sized phosphors and nano-sized phosphor ink composition and their preparation methods are described in the following description.

Figure 1:
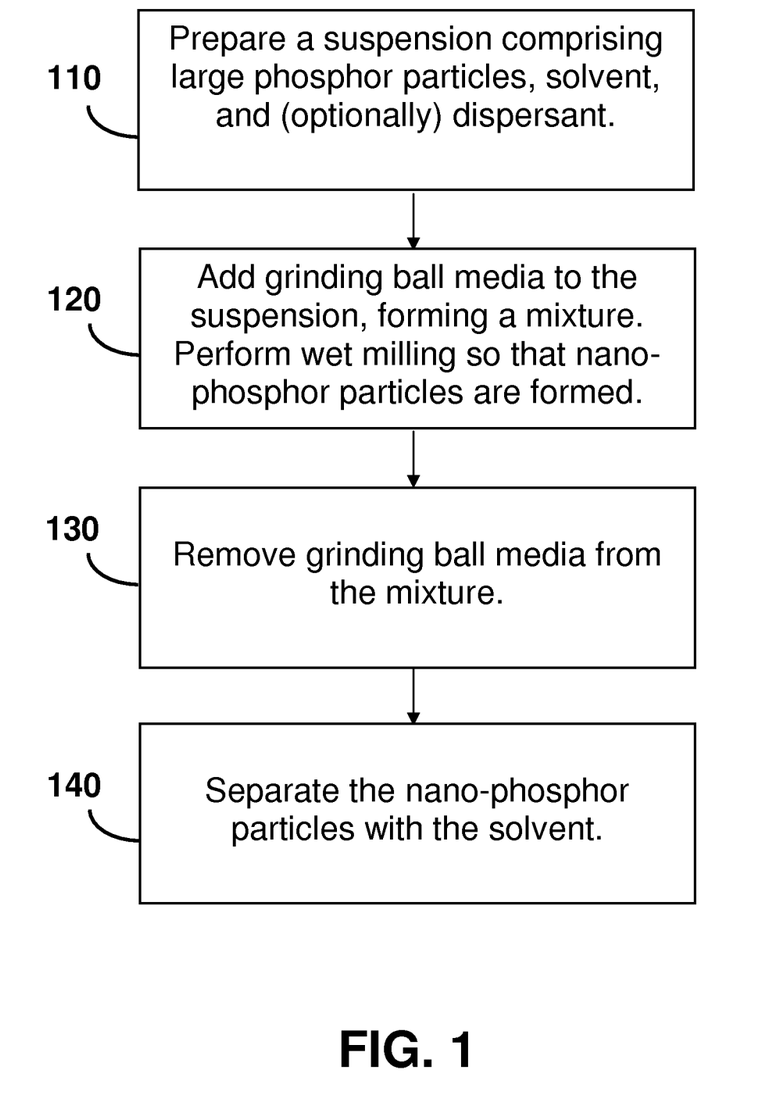
FIG. 1 is a flowchart illustrating a method for forming nano-phosphor particles from larger particles by solvent wet milling.

To create the ideal particle size range for the phosphor inks, the particle sizes are carefully controlled through precise wet milling to create a particle size range such that particle settling is minimized—that is, the dispersion is maintained. FIG. 1 depicts a method for forming nano-phosphor particles from larger particles by solvent wet milling. A suspension is prepared by dispersing the larger phosphor particles with a solvent. Optionally, a dispersant is included in the suspension to facilitate dispersing the larger phosphor particles in the solvent. Grinding ball media are then added to the suspension to form a mixture. Wet milling is performed on the mixture in a commercial attritor/a grinding mill until a substantial portion of the larger phosphor particles have been converted into particles on the order of 100 to 1000 nanometers. Thereby, the nano-phosphor particles are formed in the mixture. To detect/ensure that the substantial portion of the larger phosphor particles have been converted into nano-sized particles, a small sample of the mixture is removed and subjected to particle size measurement. After wet milling, the mixture may be filtered with, e.g., a screen mesh, to remove the grinding ball media there from. The nano-phosphor particles may be obtained by separating these particles from other components in the mixture by, e.g., a centrifuge machine.

Figure 2A:
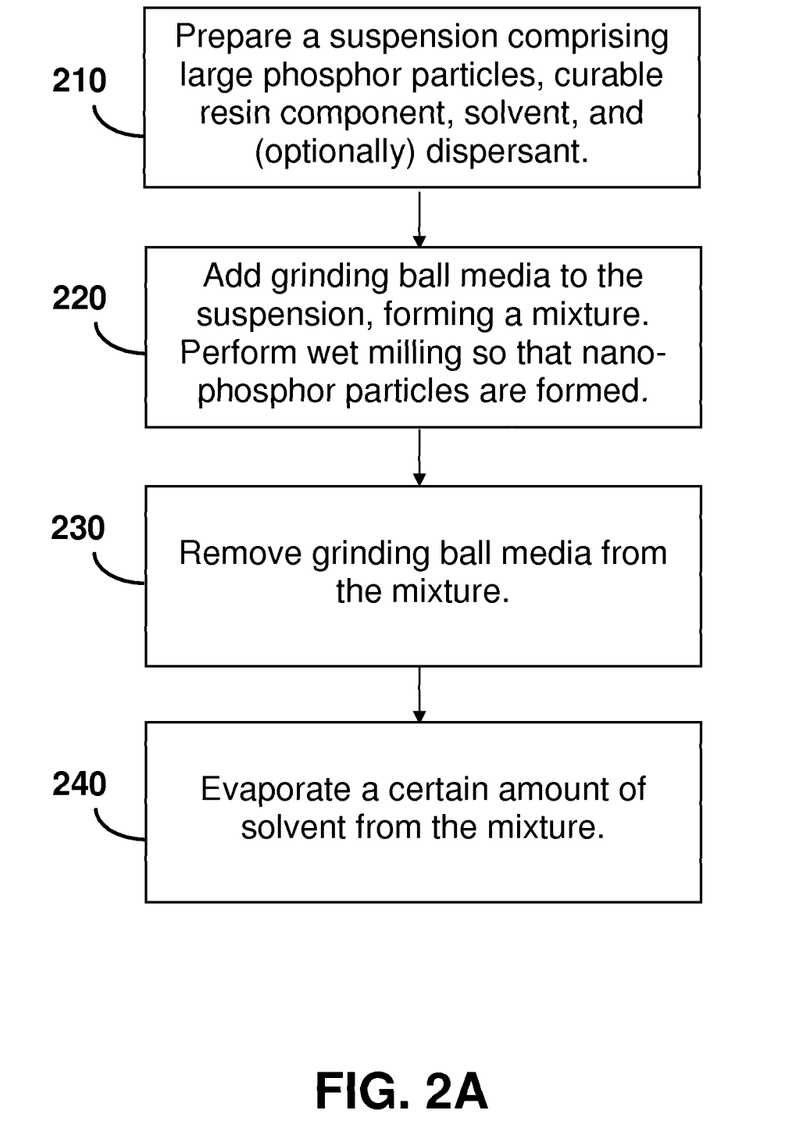
FIG. 2A is a flowchart showing a method for preparing a phosphor ink composition based on forming nano-phosphor particles from larger particles in accordance with an embodiment of the present invention.

Preferably, the phosphor inks are prepared without physically separating the nano-phosphor particles from other components of the mixture. FIG. 2A shows an embodiment of preparing a phosphor ink composition that provides a viscosity according to a viscosity requirement as required by the drop dispense method or the ink-jet printing method. A suspension is first prepared by dispersing bulk phosphor particles and a curable resin component with a solvent.

The bulk phosphor can be yttrium aluminum garnet (YAG)-based materials (e.g. YAG:Ce), terbium aluminum garnet (TAG)-based materials (e.g. TAG:Ce), silicate-based materials (e.g. $SrBaSiO_4$:Eu), sulfur-based materials (e.g. CaS:Eu, SrS:Eu, $SrGa_2S_4$:Eu, etc.), nitrogen-based materials (e.g. $Sr_2Si_5N_8$:Eu, $Ba_2Si_5N_8$:Eu, etc.), or nitrogen oxide based materials (e.g. Ca-α-SiAlON:Eu, $SrSi_2O_2N_2$:Eu, etc.).

The curable resin component can be a UV-curable resin (e.g. Tego 2100, Tego 2200, etc.) or a thermally curable resin (e.g. Dow Corning 6550, Dow Corning 6551, Shin-Etsu 9022, LPS5547, etc.), or both. If the formulation includes UV-curable resin, Initiator (e.g. Irgacure 2959, etc.) is needed.

The solvent can be any commonly used organic solvent such as ethanol, acetone, 2-pentanone, 1-pentanol, isopropanol, etc.

Optionally, a dispersant is included in the suspension. The dispersant can be Tego 655, Tego 710, Solsperse 22000, Zetasperse 2100, etc.

Grinding ball media are then added to the suspension to form a first mixture. The first mixture is performed with wet milling until a substantial portion of the bulk phosphor particles have been converted to nano-sized particles. As mentioned above, a small sample of the first mixture is removed and subjected to particle size measurement to detect and ensure that most of the bulk phosphor particles are converted. After wet milling, the first mixture is filtered with a filter, which may be a screen mesh, to remove the grinding ball media from the first mixture, thereby forming a second mixture. A portion of the solvent is evaporated from the second mixture until viscosity of the second mixture is substantially close to the required value of viscosity. The phosphor ink is thereby obtained as the second mixture after evaporation.

Figure 2B:
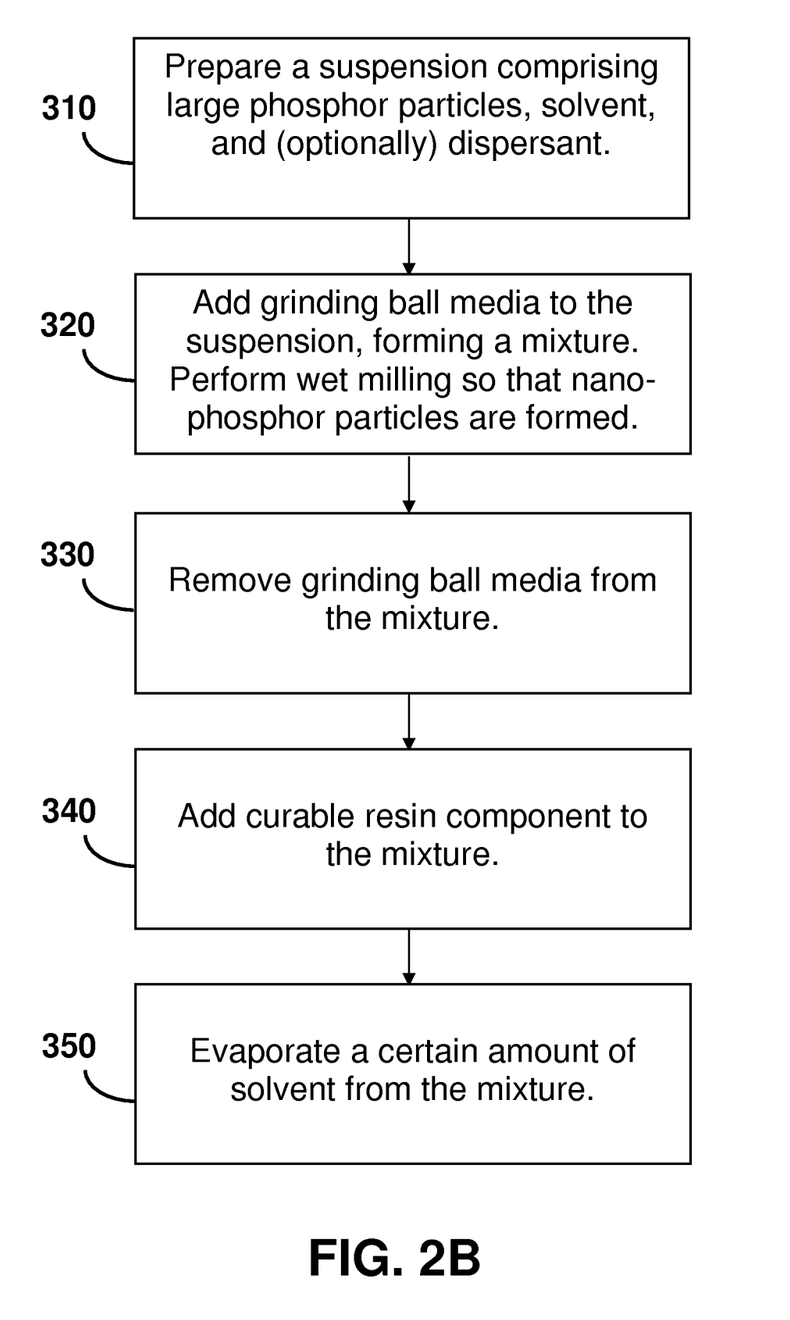
FIG. 2B is a flowchart showing another method for preparing a phosphor ink composition based on forming nano-phosphor particles from larger particles in accordance with another embodiment of the present invention.

FIG. 2B shows another embodiment of preparing a phosphor ink composition that provides a required viscosity. This embodiment is different from the embodiment shown in FIG. 2A in that a curable resin component is not added before wet milling. In the embodiment of FIG. 2B, a suspension is first prepared by dispersing bulk phosphor particles with a solvent. As mentioned above, a dispersant may be included in the suspension. Grinding ball media are then added to the suspension to form a first mixture. The first mixture is wet-milled until it is detected, by particle size measurement on a small sample of the first mixture, that a substantial portion of the bulk phosphor particles have been converted to nano-sized particles. Afterwards, the grinding ball media are removed from the first mixture by filtering with a filter, which may be a screen mesh, to form a second mixture. At this stage, the curable resin component is added to and well dispersed with the second mixture to form a third mixture. A portion of the solvent is evaporated from the third mixture until viscosity of the third mixture is substantially close to the given value of viscosity, giving the phosphor ink.

According to different phosphor deposition methods, for example, the drop dispense method or the ink-jetting printing method, there can be difference in the nano-sized phosphor ink composition.

that most of the bulk phosphor particles are converted. After wet milling, the first mixture is filtered with a screen mesh, to remove the grinding ball media from the first mixture, thereby forming a second mixture. Let all the solvent in the second mixture evaporate and get the final nano-sized phosphor ink formulation for the drop dispense method. The photoelectric measurement parameters of the LED packaged by the drop dispense method using the ink composition with nano phosphor particles in our invention are shown below:

|  | Power | Chip Size | CCT | Luminous Flux | CRI |
|---|---|---|---|---|---|
| LED packaged with nano-phosphor (200-300 nanometer) ink composition of our invention | 1 W | 38 mil × 38 mil | 6000~6500K | 124 lm@350 mA | 73 |
| LED packaged by conventional method with bulk phosphor particles (Intematix YAG-04, 15 micron) | 1 W | 38 mil × 38 mil | 6000~6500K | 128 lm@350 mA | 73 |

For the drop dispense method, the ink composition can be formulated as follow:

| Material class | Examples | Composition Range (weight %) |
|---|---|---|
| Nano-phosphor (solvent wet milled) | (YAG)-based materials (e.g. YAG:Ce), terbium aluminum garnet (TAG)-based materials (e.g. TAG:Ce), silicate-based (e.g. SrBaSiO$_4$:Eu), sulfur-based (e.g. CaS:Eu, SrS:Eu, SrGa$_2$S$_4$:Eu, etc.), nitrogen-based (e.g. Sr$_2$Si$_5$N$_8$:Eu, Ba$_2$Si$_5$N$_8$:Eu, etc.), or nitrogen oxide based materials (e.g. Ca-α-SiAlON:Eu, SrSi$_2$O$_2$N$_2$:Eu, etc.) | 1-60 |
| Thermally curable resin | Dow Corning 6550, Dow Corning 6551, Shin-Etsu 9022, LPS5547 | 25-99 |
| Dispersant | Tego 655, Tego 710, Solsperse 22000, Zetasperse 2100 | 0-15 |

The ink composition shown above is regarded as an embodiment. It is understood that the ink composition disclosed in the present invention for the drop dispense method can be prepared with any type of nano-phosphor, curable resin and dispersant known in the art.

As all the solvent is evaporated during the preparation of the ink composition for the drop dispense method, it is not shown in the composition table above.

With reference to the composition table above, examples regarding preparation of the inks for the drop dispense method are given as follows.

Example 1

Add 6 g of YAG:Ce (bulk phosphor) and 94 g of Dow Corning 6550 (curable resin) to 200 cc of acetone (solvent) to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let all the solvent in the second mixture evaporate and get the final nano-sized phosphor ink formulation for the drop dispense method.

As can be seen according to the measurement data, the light conversion efficiency of the nano-phosphor particles of size from 100 to 1000 nanometers in this invention can achieve over 90% of that using the bulk phosphor particles.

Example 2

Add 1 g of YAG:Ce (bulk phosphor) and 99 g of Dow Corning 6550 (curable resin) to 200 cc of acetone (solvent) to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let all the solvent in the second mixture evaporate and get the final nano-sized phosphor ink formulation for the drop dispense method.

Example 3

Add 60 g of TAG:Ce (bulk phosphor) and 40 g of Dow Corning 6551 (curable resin) to 200 cc of acetone (solvent) to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let all the solvent in the second mixture evaporate and get the final nano-sized phosphor ink formulation for the drop dispense method.

Example 4

Add 54 g of YAG:Ce, 6 g of Ca-α-SiAlON:Eu (both constituting the bulk phosphor), 25 g of Shin-Etsu 9022 (curable resin) and 15 g of Tego 655 (dispersant) to 200 cc of acetone (solvent) to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let all the solvent in the second mixture evaporate and get the final ink formulation for the drop dispense method.

Example 5

Add 30 g of YAG:Ce (bulk phosphor) and 3 g of Zetasperse 2100 (dispersant) to 200 cc of acetone (solvent) to form a suspension. Grinding ball media are then added to the suspension to form a first mixture. The first mixture is wet-milled until it is detected, by particle size measurement on a small sample of the first mixture, that a substantial portion of the bulk phosphor particles have been converted to nano-sized particles. Afterwards, the grinding ball media are removed from the first mixture by filtering with a screen mesh, to form a second mixture. At this stage, 67 g of Shin-Etsu LPS-5547 (the curable resin component) is added to and well dispersed with the second mixture to form a third mixture. Let all the solvent in the third mixture evaporate and get the final nano-sized phosphor ink formulation for the drop dispense method.

For the ink-jet printing method, the ink composition can be formulated as follows:

| Material class | Examples | Composition Range (weight %) |
| --- | --- | --- |
| Nano-phosphor (solvent wet milled) | yttrium aluminum garnet (YAG)-based materials (e.g. YAG:Ce), terbium aluminum garnet (TAG)-based materials (e.g. TAG:Ce), and silicate-based (e.g. $SrBaSiO_4$:Eu), sulfur-based (e.g. CaS:Eu, SrS:Eu, $SrGa_2S_4$:Eu, etc.), nitrogen-based (e.g. $Sr_2Si_5N_8$:Eu, $Ba_2Si_5N_8$:Eu, etc.), or nitrogen oxide based materials (e.g. Ca-α-SiAlON:Eu, $SrSi_2O_2N_2$:Eu, etc.) | 1-15 |
| UV curable silicone | Tego 2100, Tego 2200 | 1-15 |
| Dispersant | Tego 655, Tego 710, Solsperse 22000, Zetasperse 2100 | 0.2-15 |
| UV Initiator | Irgacure 2959 | 0.2-4 |
| Solvent | 2-pentanone, 1-pentanol, isopropanol | 51-97.6 |

The ink composition shown above is regarded as an embodiment. It is understood that the ink composition disclosed in the present invention for the ink-jet printing method can be prepared with any type of nano-phosphor, curable resin and dispersant known in the art.

With reference to the composition table above, examples regarding preparation of the inks for the ink-jet printing method are given as follows.

Example 6

Add 1 g of YAG:Ce (bulk phosphor), 1 g of Tego 2100 (curable resin), 0.2 g of UV Initiator, and 0.2 g of Solsperse 22000 (dispersant) to 300 cc of 2-pentanone (solvent) to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let part of the solvent in the second mixture evaporate such that the remaining solvent has a weight of 97.6 g, and get the final nano-sized phosphor ink formulation used in the ink-jet printing method.

Example 7

Add 15 g of YAG:Ce (bulk phosphor), 15 g of Tego 2100 (curable resin), 4 g of UV Initiator, and 15 g of Tego 710 (dispersant) to 300 cc of isopropanol (solvent) to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let part of the solvent in the second mixture evaporate such that the remaining solvent has a weight of 51 g, and get the final nano-sized phosphor ink formulation for the ink-jet printing method.

Example 8

Add 5 g of SrBaSi:Eu (bulk phosphor), 10 g of Tego 2100 (curable resin), 1 g of UV Initiator, and 1 g of Solsperse 22000 (dispersant) to 300 cc of 1-pentanol to form a suspension. Grinding ball media are then added to the suspension to form a first mixture. The first mixture is performed with wet milling until a substantial portion of the bulk phosphor particles have been converted to nano-sized particles. A small sample of the first mixture is removed and subjected to particle size measurement to detect and ensure that most of the bulk phosphor particles are converted. After wet milling, the first mixture is filtered with a screen mesh, to remove the grinding ball media from the first mixture, thereby forming a second mixture. Let part of the solvent in the second mixture evaporate such that the remaining solvent has a weight of 83 g, and get the final nano-sized phosphor ink formulation for the ink-jet printing method.

Example 9

Add 10 g of YAG:Ce, 1 g of $Sr_2Si_5N_8$:Eu (both constituting the bulk phosphor), and 3 g of Zetasperse 2100 (di spersant) to 300 cc of 1-pentanol to form a suspension. Grinding ball media are then added to the suspension to form a first mixture. The first mixture is wet-milled until it is detected, by particle size measurement on a small sample of the first mixture, that a substantial portion of the bulk phosphor particles have been converted to nano-sized particles. Afterwards, the grinding ball media are removed from the first mixture by filtering with a screen mesh, to form a second mixture. At this stage, 8 g of Tego 2200 (the curable resin component) and 0.4 g of UV Initiator are added to and well dispersed with the second mixture to form a third mixture. Let part of the solvent in the third mixture evaporate such that the remaining solvent has a weight of 77.6 g, and get the final nano-sized phosphor ink formulation for the ink-jet printing method.

While the foregoing invention has been described in terms of the above exemplary embodiments and examples, it is understood that various modifications and variations are possible. Accordingly, such modifications and variations are within the scope of the invention as set forth in the following claims.

What is claimed is:

1. A phosphor ink composition for deposition on an LED or an LED device, comprising:
   a curable resin component including a UV-curable resin;
   a phosphor component comprising nano-phosphor particles on the order of 100 to 1000 nanometers, the nano-phosphor particles being uniformly dispersed throughout the ink composition; and
   a photoinitiator for UV curing, wherein the photoinitiator is present in an amount from approximately 0.2 weight percent to approximately 4 weight percent.

2. The phosphor ink composition according to claim 1, wherein the nano-phosphor particles are formed by a size reduction process carried out on larger phosphor particles on the order of 1 to 50 micrometers.

3. The phosphor ink composition according to claim 2, wherein the size reduction process is based on solvent wet milling.

4. The phosphor ink composition according to claim 1, wherein the phosphor component is selected from yttrium aluminum garnet (YAG)-based materials, terbium aluminum garnet (TAG)-based materials, silicate-based materials, sulfur-based materials, nitrogen-based materials, and nitrogen oxide based materials.

5. The phosphor ink composition according to claim 1, wherein the curable resin component further comprises a thermally curable resin.

6. The phosphor ink composition according to claim 5, wherein the thermally curable resin comprises a two part silicone resin.

7. The phosphor ink composition according to claim 5, wherein the UV-curable resin is a UV curable silicone or a silicone acrylate.

8. The phosphor ink composition according to claim 1, wherein the phosphor component is present in an amount from approximately 1 weight percent to approximately 60 weight percent.

9. The phosphor ink composition according to claim 1, wherein the curable resin component is present in an amount from approximately 25 weight percent to approximately 99 weight percent.

10. The phosphor ink composition according to claim 1, wherein:
    the curable resin component further comprises a thermally curable resin; and
    the ink composition has a viscosity less than approximately 50 centipoise such that the ink is configured for printing by an ink jet printer.

11. The phosphor ink composition according to claim 10, further comprising a solvent, wherein the solvent is present in an amount from approximately 51 weight percent to approximately 97.6 weight percent.

12. The phosphor ink composition according to claim 11, wherein the solvent is selected from 2-propanol, 1-pentanol or 2-pentanone.

13. The phosphor ink composition according to claim 10, further comprising a dispersant, wherein the dispersant is present in an amount from approximately 0.2 weight percent to approximately 15 weight percent.

14. The phosphor ink composition according to claim 10, wherein the phosphor component is present in an amount from approximately 1 weight percent to approximately 15 weight percent.

15. The phosphor ink composition according to claim 10, wherein the curable resin component is present in an amount from approximately 1 weight percent to approximately 15 weight percent.

16. A method of preparing the phosphor ink composition of claim 1, the method comprising forming the nano-phosphor particles from larger phosphor particles by a size reduction process;
    wherein the size reduction process comprises:
        preparing a suspension comprising at least the larger phosphor particles and a solvent;
        performing wet milling on the suspension so as to convert a substantial portion of the larger phosphor particles into the nano-sized phosphor particles in the suspension; and
        separating the phosphor particles from other component of the suspension.

17. A method of preparing the phosphor ink composition of claim 1, the method comprising:
    dispersing bulk phosphor particles and the curable resin component with a solvent to form a suspension;
    performing wet milling on the suspension so as to convert a substantial portion of the bulk phosphor particles into the nano-sized phosphor particles in the suspension; and
    evaporating a portion of the solvent from the suspension after wet milling to form the phosphor ink composition.

18. A method of preparing the phosphor ink composition of claim 1, the method comprising:
    dispersing bulk phosphor particles with a solvent to form a suspension;
    performing wet milling on the suspension so as to convert a substantial portion of the bulk phosphor particles into the nano-sized phosphor particles in the suspension;
    adding the curable resin component to the suspension after wet milling; and
    evaporating a portion of the solvent from the suspension after adding with the curable resin component to form the phosphor ink composition.

19. The phosphor ink composition according to claim 1, wherein the curable resin component and the size of the nano-phosphor particles are selected such that the nano-phosphor particles settle very slowly in the ink composition after deposition and prior to curing, thereby enabling forming a uniform cured phosphor layer on the LED device or the LED device packaging.

* * * * *